US008860364B2

(12) United States Patent
Low et al.

(10) Patent No.: US 8,860,364 B2
(45) Date of Patent: Oct. 14, 2014

(54) WIRELESS POWER DISTRIBUTION AMONG A PLURALITY OF RECEIVERS

(75) Inventors: Zhen Ning Low, La Jolla, CA (US); Charles E. Wheatley, III, San Diego, CA (US); William H. Von Novak, San Diego, CA (US); Sergio P. Estrada, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 718 days.

(21) Appl. No.: 12/951,269

(22) Filed: Nov. 22, 2010

(65) Prior Publication Data

US 2011/0260682 A1 Oct. 27, 2011

Related U.S. Application Data

(60) Provisional application No. 61/327,532, filed on Apr. 23, 2010.

(51) Int. Cl.
*H02J 7/00* (2006.01)
*H04B 5/00* (2006.01)
*H02J 7/02* (2006.01)

(52) U.S. Cl.
CPC ............ *H02J 7/0027* (2013.01); *H04B 5/0037* (2013.01); *H02J 7/025* (2013.01); *H04B 5/0081* (2013.01)
USPC .......................................... 320/108; 320/125

(58) Field of Classification Search
USPC ................... 320/108, 114, 125, 134; 323/293
See application file for complete search history.

(56) References Cited

U.S. PATENT DOCUMENTS

| 7,411,895 B2 | 8/2008 | Laroia et al. |
| 2008/0116847 A1 | 5/2008 | Loke et al. |
| 2009/0096413 A1* | 4/2009 | Partovi et al. .................. 320/108 |

FOREIGN PATENT DOCUMENTS

| WO | WO2005109597 A1 | 11/2005 |
| WO | WO2008137996 A1 | 11/2008 |

OTHER PUBLICATIONS

International Search Report and Written Opinion—PCT/CN2011/033672—ISA/EPO—Aug. 2, 2012.

* cited by examiner

*Primary Examiner* — Edward Tso
*Assistant Examiner* — Aaron Piggush
(74) *Attorney, Agent, or Firm* — Knobbe Martens Olson & Bear, LLP (57) ABSTRACT

Exemplary embodiments are directed to power distribution among a plurality of receivers. A method may include requesting at least one receiver of a plurality of receivers within a charging region of a transmitter to modify an associated load resistance to achieve a desired power distribution among the plurality of receivers. The method may further include requesting each receiver of the plurality of receivers to modify an associated load resistance to achieve a desired total impedance as seen by the transmitter while maintaining the desired power distribution among the plurality of receivers.

23 Claims, 10 Drawing Sheets

WIRELESS POWER DISTRIBUTION AMONG A PLURALITY OF RECEIVERS

CLAIM OF PRIORITY UNDER 35 U.S.C. §119

This application claims priority under 35 U.S.C. §119(e) to:

U.S. Provisional Patent Application 61/327,532 entitled "POWER DISTRIBUTION BETWEEN MULTIPLE RECEIVERS DURING CHARGING" filed on Apr. 23, 2010, the disclosure of which is hereby incorporated by reference in its entirety.

BACKGROUND

1. Field

The present invention relates generally to wireless power, and more specifically, to systems, device, and methods related for controlling power distribution among a plurality of wireless receivers. Further, the present invention relates to systems, device, and methods related for enhancing wireless power transfer by achieving an optimum total impedance as seen by the transmitter due to a plurality of receivers.

2. Background

Approaches are being developed that use over the air power transmission between a transmitter and the device to be charged. These generally fall into two categories. One is based on the coupling of plane wave radiation (also called far-field radiation) between a transmit antenna and receive antenna on the device to be charged which collects the radiated power and rectifies it for charging the battery. Antennas are generally of resonant length in order to improve the coupling efficiency. This approach suffers from the fact that the power coupling falls off quickly with distance between the antennas. So charging over reasonable distances (e.g., >1-2 m) becomes difficult. Additionally, since the system radiates plane waves, unintentional radiation can interfere with other systems if not properly controlled through filtering.

Other approaches are based on inductive coupling between a transmit antenna embedded, for example, in a "charging" mat or surface and a receive antenna plus rectifying circuit embedded in the host device to be charged. This approach has the disadvantage that the spacing between transmit and receive antennas must be very close (e.g. mms). Though this approach does have the capability to simultaneously charge multiple devices in the same area, this area is typically small, hence the user must locate the devices to a specific area.

Due to variations in mutual inductances between a transmitting coil and receiving coils of different receivers plus further variations in mutual inductance seen at different locations within a transmitting coil, power delivery to the respective receivers can be markedly different during concurrent charging. It is desirable that a wireless power system to be able to direct power to the respective receivers depending on the power requirements and/or characteristics (bluetooth, phone, PDA) of the receivers, while at the same time maintaining the efficiency of the charging process to each and all of the receivers.

A need exists for methods, systems, and devices to for controlling power distribution among a plurality of receivers while maintaining power transfer efficiency to the plurality of receivers.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

The term "wireless power" is used herein to mean any form of energy associated with electric fields, magnetic fields, electromagnetic fields, or otherwise that is transmitted between a transmitter to a receiver without the use of physical electrical conductors.

Figure 1:
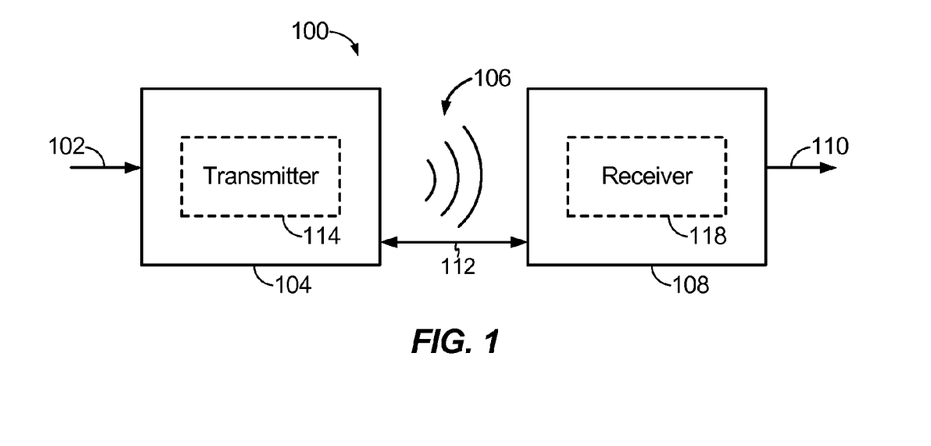
FIG. 1 shows a simplified block diagram of a wireless power transfer system.

FIG. 1 illustrates a wireless transmission or charging system 100, in accordance with various exemplary embodiments of the present invention. Input power 102 is provided to a transmitter 104 for generating a radiated field 106 for providing energy transfer. A receiver 108 couples to the radiated field 106 and generates an output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship and when the resonant frequency of receiver 108 and the resonant frequency of transmitter 104 are very close, transmission losses between the transmitter 104 and the receiver 108 are minimal when the receiver 108 is located in the "near-field" of the radiated field 106.

Transmitter 104 further includes a transmit antenna 114 for providing a means for energy transmission and receiver 108 further includes a receive antenna 118 for providing a means for energy reception. The transmit and receive antennas are sized according to applications and devices to be associated therewith. As stated, an efficient energy transfer occurs by coupling a large portion of the energy in the near-field of the transmitting antenna to a receiving antenna rather than propagating most of the energy in an electromagnetic wave to the far field. When in this near-field a coupling mode may be developed between the transmit antenna 114 and the receive antenna 118. The area around the antennas 114 and 118 where this near-field coupling may occur is referred to herein as a coupling-mode region.

Figure 2:
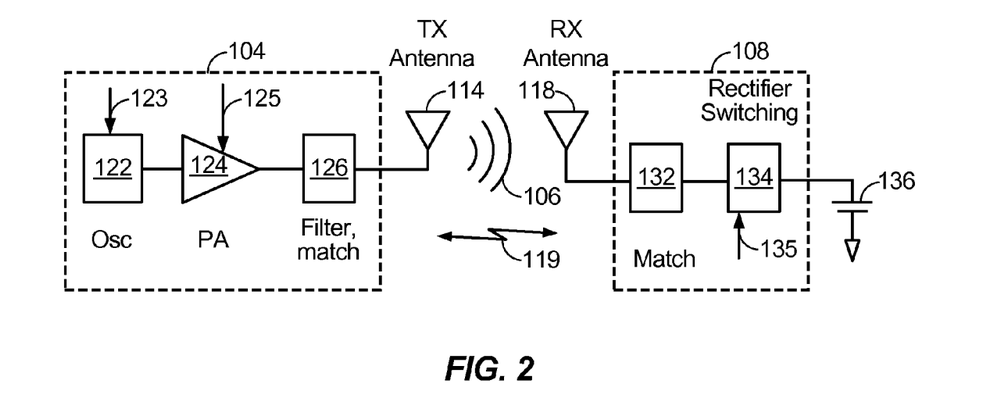
FIG. 2 shows a simplified schematic diagram of a wireless power transfer system.

FIG. 2 shows a simplified schematic diagram of a wireless power transfer system. The transmitter 104 includes an oscillator 122, a power amplifier 124 and a filter and matching circuit 126. The oscillator is configured to generate at a desired frequency, such as 468.75 KHz, 6.78 MHz or 13.56, which may be adjusted in response to adjustment signal 123. The oscillator signal may be amplified by the power amplifier 124 with an amplification amount responsive to control signal 125. The filter and matching circuit 126 may be included to filter out harmonics or other unwanted frequencies and match the impedance of the transmitter 104 to the transmit antenna 114.

The receiver 108 may include a matching circuit 132 and a rectifier and switching circuit 134 to generate a DC power output to charge a battery 136 as shown in FIG. 2 or power a device coupled to the receiver (not shown). The matching circuit 132 may be included to match the impedance of the receiver 108 to the receive antenna 118. The receiver 108 and transmitter 104 may communicate on a separate communication channel 119 (e.g., Bluetooth, zigbee, cellular, etc).

Figure 3:
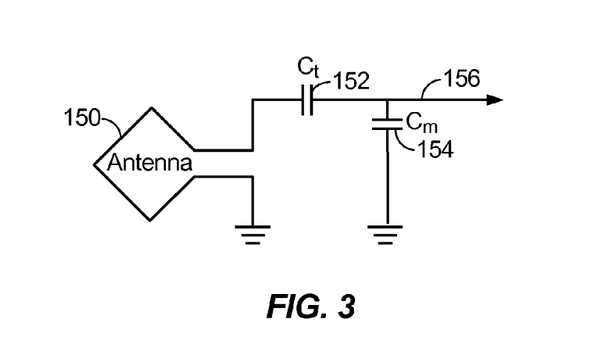
FIG. 3 illustrates a schematic diagram of a loop antenna for use in exemplary embodiments of the present invention.

As illustrated in FIG. 3, antennas used in exemplary embodiments may be configured as a "loop" antenna 150, which may also be referred to herein as a "magnetic" antenna. Loop antennas may be configured to include an air core or a physical core such as a ferrite core. Air core loop antennas may be more tolerable to extraneous physical devices placed in the vicinity of the core. Furthermore, an air core loop antenna allows the placement of other components within the core area. In addition, an air core loop may more readily enable placement of the receive antenna 118 (FIG. 2) within a plane of the transmit antenna 114 (FIG. 2) where the coupled-mode region of the transmit antenna 114 (FIG. 2) may be more powerful.

As stated, efficient transfer of energy between the transmitter 104 and receiver 108 occurs during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the near-field of the transmitting antenna to the receiving antenna residing in the neighborhood where this near-field is established rather than propagating the energy from the transmitting antenna into free space.

The resonant frequency of the loop or magnetic antennas is based on the inductance and capacitance. Inductance in a loop antenna is generally simply the inductance created by the loop, whereas, capacitance is generally added to the loop antenna's inductance to create a resonant structure at a desired resonant frequency. As a non-limiting example, capacitor 152 and capacitor 154 may be added to the antenna to create a resonant circuit that generates resonant signal 156. Accordingly, for larger diameter loop antennas, the size of capacitance needed to induce resonance decreases as the diameter or inductance of the loop increases. Furthermore, as the diameter of the loop or magnetic antenna increases, the efficient energy transfer area of the near-field increases. Of course, other resonant circuits are possible. As another non-limiting example, a capacitor may be placed in parallel between the two terminals of the loop antenna. In addition, those of ordinary skill in the art will recognize that for transmit antennas the resonant signal 156 may be an input to the loop antenna 150.

Figure 4:
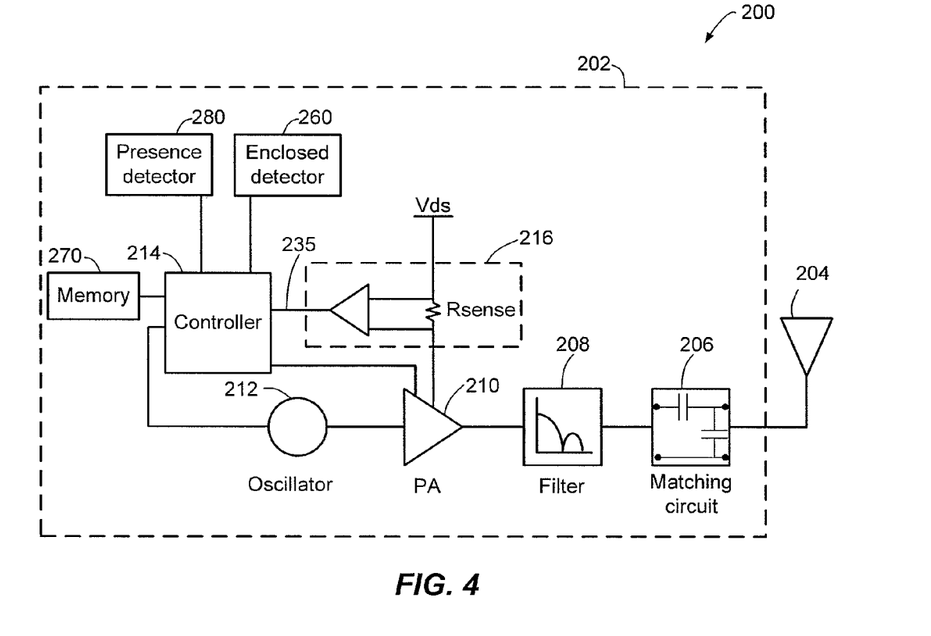
FIG. 4 is a simplified block diagram of a transmitter, in accordance with an exemplary embodiment of the present invention.

FIG. 4 is a simplified block diagram of a transmitter 200, in accordance with an exemplary embodiment of the present invention. The transmitter 200 includes transmit circuitry 202 and a transmit antenna 204. Generally, transmit circuitry 202 provides RF power to the transmit antenna 204 by providing an oscillating signal resulting in generation of near-field energy about the transmit antenna 204. It is noted that transmitter 200 may operate at any suitable frequency. By way of example, transmitter 200 may operate at the 13.56 MHz ISM band.

Exemplary transmit circuitry 202 includes a fixed impedance matching circuit 206 for matching the impedance of the transmit circuitry 202 (e.g., 50 ohms) to the transmit antenna 204 and a low pass filter (LPF) 208 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that can be varied based on measurable transmit metrics, such as output power to the antenna or DC current drawn by the power amplifier. Transmit circuitry 202 further includes a power amplifier 210 configured to drive an RF signal as determined by an oscillator 212. The transmit circuitry may be comprised of discrete devices or circuits, or alternately, may be comprised of an integrated assembly. An exemplary RF power output from transmit antenna 204 may be on the order of 2.5 Watts.

Transmit circuitry 202 further includes a controller 214 for enabling the oscillator 212 during transmit phases (or duty cycles) for specific receivers, for adjusting the frequency or phase of the oscillator, and for adjusting the output power level for implementing a communication protocol for interacting with neighboring devices through their attached receivers. As is well known in the art, adjustment of oscillator phase and related circuitry in the transmission path allows for reduction of out of band emissions, especially when transitioning from one frequency to another.

The transmit circuitry 202 may further include a load sensing circuit 216 for detecting the presence or absence of active receivers in the vicinity of the near-field generated by transmit antenna 204. By way of example, a load sensing circuit 216 monitors the current flowing to the power amplifier 210, which is affected by the presence or absence of active receivers in the vicinity of the near-field generated by transmit antenna 204. Detection of changes to the loading on the power amplifier 210 are monitored by controller 214 for use in determining whether to enable the oscillator 212 for transmitting energy and to communicate with an active receiver.

Transmit antenna 204 may be implemented with a Litz wire or as an antenna strip with the thickness, width and metal type selected to keep resistive losses low. In a conventional implementation, the transmit antenna 204 can generally be configured for association with a larger structure such as a table, mat, lamp or other less portable configuration. Accordingly, the transmit antenna 204 generally will not need "turns" in order to be of a practical dimension. An exemplary implementation of a transmit antenna 204 may be "electrically small" (i.e., fraction of the wavelength) and tuned to resonate at lower usable frequencies by using capacitors to define the resonant frequency. In an exemplary application where the transmit antenna 204 may be larger in diameter, or length of side if a square loop, (e.g., 0.50 meters) relative to the receive antenna, the transmit antenna 204 will not necessarily need a large number of turns to obtain a reasonable capacitance.

The transmitter 200 may gather and track information about the whereabouts and status of receiver devices that may be associated with the transmitter 200. Thus, the transmitter circuitry 202 may include a presence detector 280, an enclosed detector 290, or a combination thereof, connected to the controller 214 (also referred to as a processor herein). The controller 214 may adjust an amount of power delivered by the amplifier 210 in response to presence signals from the presence detector 280 and the enclosed detector 290. The transmitter may receive power through a number of power sources, such as, for example, an AC-DC converter (not shown) to convert conventional AC power present in a building, a DC-DC converter (not shown) to convert a conventional DC power source to a voltage suitable for the transmitter 200, or directly from a conventional DC power source (not shown).

As described more fully below, transmitter 200 may configured to determine, via, for example, a clocking method, an impedance on transmitter 200 due to each receiver of a plurality of receivers positioned within an charging region of transmitter 200. Further, in response to a desired power distribution scenario, transmitter 200 and, more specifically, controller 214 may be configured to determine whether, and to what extent, a load resistance of each receiver positioned within the charging region should be modified. Moreover, controller 214 may be configured to request at least one receiver of the plurality of receivers within a charging region of transmitter 200 to modify an associated load resistance to achieve the desired power distribution among the plurality of receivers. Controller 214 may also be configured to request each receiver of the plurality of receivers to modify an associated load resistance to achieve a desired total impedance as seen by transmitter 200.

As a non-limiting example, the presence detector 280 may be a motion detector utilized to sense the initial presence of a device to be charged that is inserted into the coverage area of the transmitter. After detection, the transmitter may be turned on and the RF power received by the device may be used to toggle a switch on the Rx device in a pre-determined manner, which in turn results in changes to the driving point impedance of the transmitter.

As another non-limiting example, the presence detector 280 may be a detector capable of detecting a human, for example, by infrared detection, motion detection, or other suitable means. In some exemplary embodiments, there may be regulations limiting the amount of power that a transmit antenna may transmit at a specific frequency. In some cases, these regulations are meant to protect humans from electromagnetic radiation. However, there may be environments where transmit antennas are placed in areas not occupied by humans, or occupied infrequently by humans, such as, for example, garages, factory floors, shops, and the like. If these environments are free from humans, it may be permissible to increase the power output of the transmit antennas above the normal power restrictions regulations. In other words, the controller 214 may adjust the power output of the transmit antenna 204 to a regulatory level or lower in response to human presence and adjust the power output of the transmit antenna 204 to a level above the regulatory level when a human is outside a regulatory distance from the electromagnetic field of the transmit antenna 204.

As a non-limiting example, the enclosed detector 290 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In exemplary embodiments, a method by which the transmitter 200 does not remain on indefinitely may be used. In this case, the transmitter 200 may be programmed to shut off after a user-determined amount of time. This feature prevents the transmitter 200, notably the power amplifier 210, from running long after the wireless devices in its perimeter are fully charged. This event may be due to the failure of the circuit to detect the signal sent from either the repeater or the receive coil that a device is fully charged. To prevent the transmitter 200 from automatically shutting down if another device is placed in its perimeter, the transmitter 200 automatic shut off feature may be activated only after a set period of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
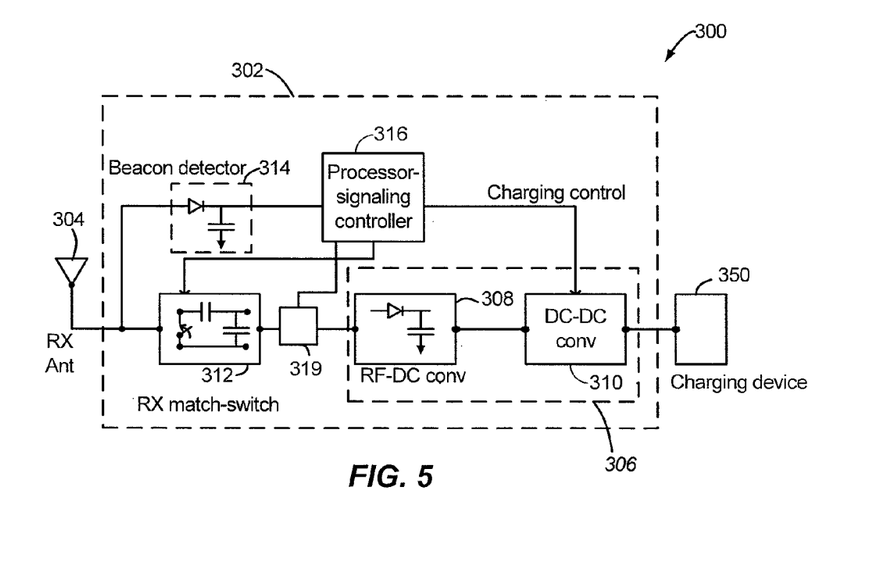
FIG. 5 is a simplified block diagram of a receiver, in accordance with an exemplary embodiment of the present invention.

FIG. 5 is a simplified block diagram of a receiver 300, in accordance with an exemplary embodiment of the present invention. The receiver 300 includes receive circuitry 302 and a receive antenna 304. Receiver 300 further couples to device 350 for providing received power thereto. It should be noted that receiver 300 is illustrated as being external to device 350 but may be integrated into device 350. Generally, energy is propagated wirelessly to receive antenna 304 and then coupled through receive circuitry 302 to device 350.

Receive antenna 304 is tuned to resonate at the same frequency, or within a specified range of frequencies, as transmit antenna 204 (FIG. 4). Receive antenna 304 may be similarly dimensioned with transmit antenna 204 or may be differently sized based upon the dimensions of the associated device 350. By way of example, device 350 may be a portable electronic device having diametric or length dimension smaller that the diameter of length of transmit antenna 204. In such an example, receive antenna 304 may be implemented as a multi-turn antenna in order to reduce the capacitance value of a tuning capacitor (not shown) and increase the receive antenna's impedance. By way of example, receive antenna 304 may be placed around the substantial circumference of device 350 in order to maximize the antenna diameter and reduce the number of loop turns (i.e., windings) of the receive antenna and the inter-winding capacitance.

Receive circuitry 302 provides an impedance match to the receive antenna 304. Receive circuitry 302 includes power conversion circuitry 306 for converting a received RF energy source into charging power for use by device 350. Power conversion circuitry 306 includes an RF-to-DC converter 308 and may also in include a DC-to-DC converter 310. RF-to-DC converter 308 rectifies the RF energy signal received at receive antenna 304 into a non-alternating power while DC-to-DC converter 310 converts the rectified RF energy signal into an energy potential (e.g., voltage) that is compatible with device 350. Various RF-to-DC converters are contemplated, including partial and full rectifiers, regulators, bridges, doublers, as well as linear and switching converters.

Receive circuitry 302 may further include switching circuitry 312 for connecting receive antenna 304 to the power conversion circuitry 306 or alternatively for disconnecting the power conversion circuitry 306. Disconnecting receive antenna 304 from power conversion circuitry 306 not only suspends charging of device 350, but also changes the "load" as "seen" by the transmitter 200 (FIG. 2).

As disclosed above, transmitter 200 includes load sensing circuit 216 which detects fluctuations in the bias current provided to transmitter power amplifier 210. Accordingly, transmitter 200 has a mechanism for determining when receivers are present in the transmitter's near-field.

When multiple receivers 300 are present in a transmitter's near-field, it may be desirable to time-multiplex the loading and unloading of one or more receivers to enable other receivers to more efficiently couple to the transmitter. A receiver may also be cloaked in order to eliminate coupling to other nearby receivers or to reduce loading on nearby transmitters. This "unloading" of a receiver is also known herein as a "cloaking." Furthermore, this switching between unloading and loading controlled by receiver 300 and detected by transmitter 200 provides a communication mechanism from receiver 300 to transmitter 200 as is explained more fully below. Additionally, a protocol can be associated with the switching which enables the sending of a message from receiver 300 to transmitter 200. By way of example, a switching speed may be on the order of 100 μsec.

In an exemplary embodiment, communication between the transmitter and the receiver refers to a device sensing and charging control mechanism, rather than conventional two-way communication. In other words, the transmitter may use on/off keying of the transmitted signal to adjust whether energy is available in the near-field. The receivers interpret these changes in energy as a message from the transmitter. From the receiver side, the receiver may use tuning and de-tuning of the receive antenna to adjust how much power is being accepted from the near-field. The transmitter can detect this difference in power used from the near-field and interpret these changes as a message from the receiver. It is noted that other forms of modulation of the transmit power and the load behavior may be utilized.

Receive circuitry 302 may further include signaling detector and beacon circuitry 314 used to identify received energy fluctuations, which may correspond to informational signaling from the transmitter to the receiver. Furthermore, signaling and beacon circuitry 314 may also be used to detect the transmission of a reduced RF signal energy (i.e., a beacon signal) and to rectify the reduced RF signal energy into a nominal power for awakening either un-powered or power-depleted circuits within receive circuitry 302 in order to configure receive circuitry 302 for wireless charging.

Receive circuitry 302 further includes processor 316 for coordinating the processes of receiver 300 described herein including the control of switching circuitry 312 described herein. Cloaking of receiver 300 may also occur upon the occurrence of other events including detection of an external wired charging source (e.g., wall/USB power) providing charging power to device 350. Processor 316, in addition to controlling the cloaking of the receiver, may also monitor beacon circuitry 314 to determine a beacon state and extract messages sent from the transmitter. Processor 316 may also adjust DC-to-DC converter 310 for improved performance.

Receive circuitry 302 may further include load adjustment circuitry 319 for adjusting a load resistance of receiver 300. As described more fully below, receiver 300 may be configured to receive a signal from a transmitter (e.g., transmitter 200) requesting that a load resistance be changed and to what extend the load resistance is to be changed. In response thereto, receiver 300 may adjust an associated load resistance.

Figure 6:
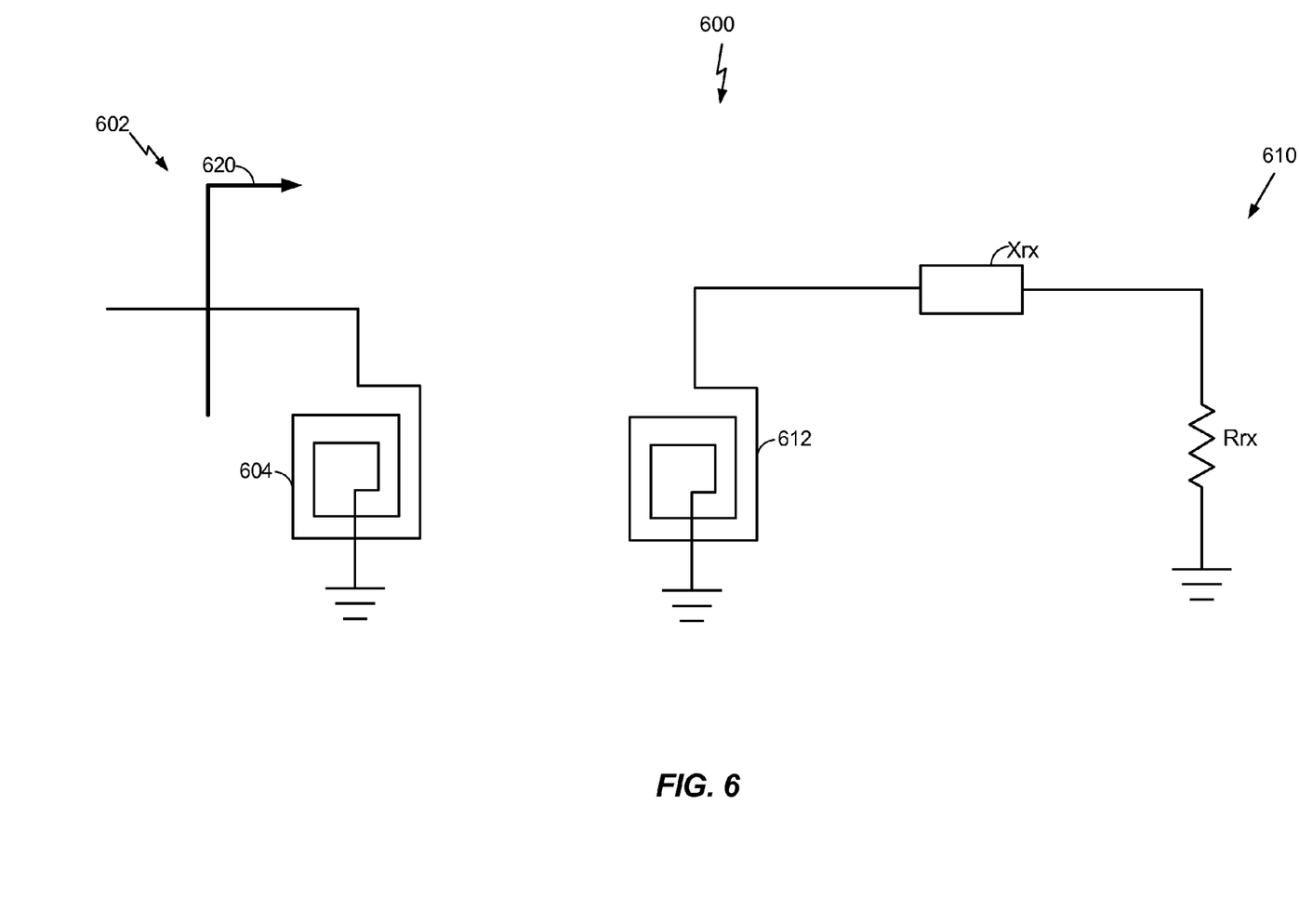
FIG. 6 is an illustration of a system including a transmitter and a receiver, in accordance with an exemplary embodiment of the present invention.

Various exemplary embodiments of the present invention, as described herein, relate to systems, devices, and methods for controlling power distribution among of plurality of receivers positioned within a charging region of a wireless power transmitter. Further, various exemplary embodiments of the present invention, as described herein, relate to systems, devices, and methods for transmitting power to a plurality of receivers while an impedance as seen by a transmit antenna due to the plurality of receivers is at an optimal level FIG. 6 illustrates a system 600 including portion of a transmitter 602 including transmitter coil 604 and a portion of a receiver 610 including a receiver coil 612. Receiver 610 further includes an imaginary load $X_{rx}$ and a real load $R_{rx}$. An impedance $Z_{tx}$, which is illustrated by arrow 620, as seen by transmitter 602 and associated with receiver 610 may be given by the following equation:

$$Z_{tx} = \frac{w^2 M_{12}^2 R_{rx}}{R_{rx}^2 + (wM_{22} + X_{rx})^2} + j\left[wM_{11} - \frac{w^2 M_{12}^2(wM_{22} + X_{rx})}{R_{rx}^2 + (wM_{22} + X_{rx})^2}\right] \quad (1)$$

wherein $Z_{tx}$ is the impedance as seen by transmitting coil 604, ω is the frequency in radians, $M_{11}$ is the self inductance of transmitting coil 604, $M_{22}$ is the self inductance of receiving coil 612, $M_{12}$ is the mutual inductance between transmitting coil 604 and receiving coil 612, $R_{rx}$ is the real load of the receiver, and $X_{rx}$ is the imaginary load of the receiver.

Furthermore, if transmitter coil 604 and receiver coil 612 are series tuned, as will be appreciated by a person having ordinary skill in the art, the impedance $Z_{tx}$ as seen by transmitter 602 and associated with receiver 610 may be given by:

$$Z_{tx} = \frac{\omega^2 M_{12}^2}{R_{rx} + R_{rx\_parasitic}} \quad (2)$$

wherein $R_{rx\_parasitic}$ a resistance of receiver coil 612.

Figure 7:
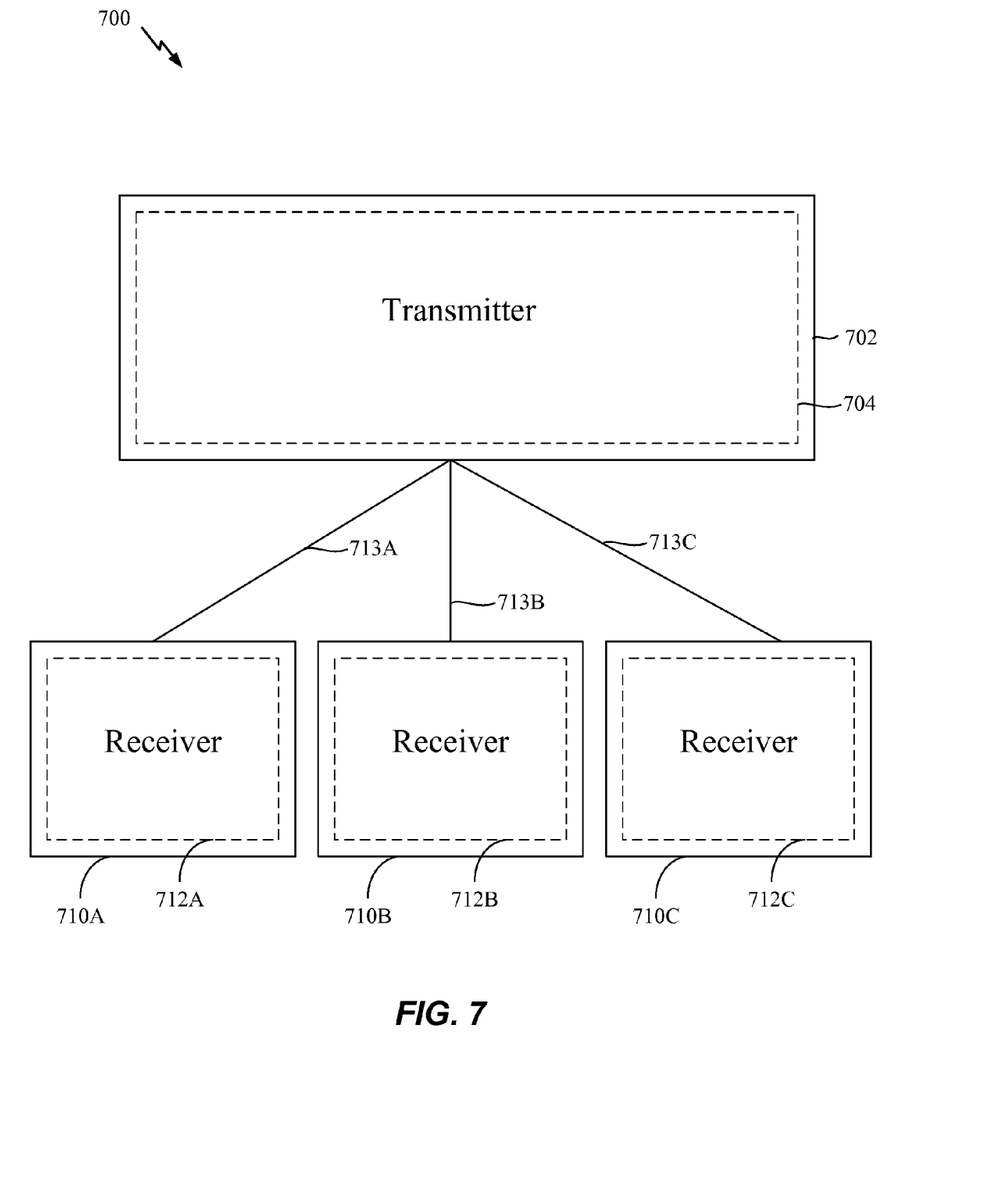
FIG. 7 is a system including a transmitter and a plurality of receivers, according to an exemplary embodiment of the present invention.

FIG. 7 illustrates a wireless power system 700 including a wireless power transmitter 702 and a plurality of wireless power receivers 710A, 710B, and 710C. Transmitter 702 includes transmit coil 704. Moreover, receiver 710A includes receiver coil 712A, receiver 710B includes receiver coil 712B, and receiver 710C includes receiver coil 712C. Receivers 710A, 710B, and 710C are each within a charging region of wireless power transmitter 702. It is noted that wireless power transmitter 702 may be configured to communicate with receivers 710A, 710B, and 710C via respective communication links 713A, 713B, and 713C. As will be understood by a person having ordinary skill in the art, an impedance transformation equation for multiple receivers (e.g., receivers 710A, 710B, and 710C) within a charging region of a transmitter (e.g., transmitter 702), wherein a receiver coil of each receiver is series tuned with a transmit coil of the transmitter, may be given by:

$$Z_{tx} = \sum_{i=m}^{n} \frac{\omega^2 M_{12_i}^2}{R_{rx_i}} = \frac{\omega^2 M_{12_1}^2}{R_{rx_1}} + \frac{\omega^2 M_{12_2}^2}{R_{rx_2}} + \frac{\omega^2 M_{12_3}^2}{R_{rx_3}} + \ldots + \frac{\omega^2 M_{12_n}^2}{R_{rx_n}} \quad (3)$$

wherein n the total number of receivers, $M_{12i}$ is the mutual inductance between the transmitting coil and a receiver i, $M_{rxi}$ is the real load of receiver i, and $R_{tx\_parasitic}$ is the parasitic resistance of the transmitting coil.

With reference to equation (3), it is noted that power distribution between the receivers is proportional to the impedance presented to the transmitter by individual receivers. Therefore, as a load of a receiver increases, the receiver may receiver less power and as the load of the receiver decreases, the receiver may receiver more power.

Figure 8:
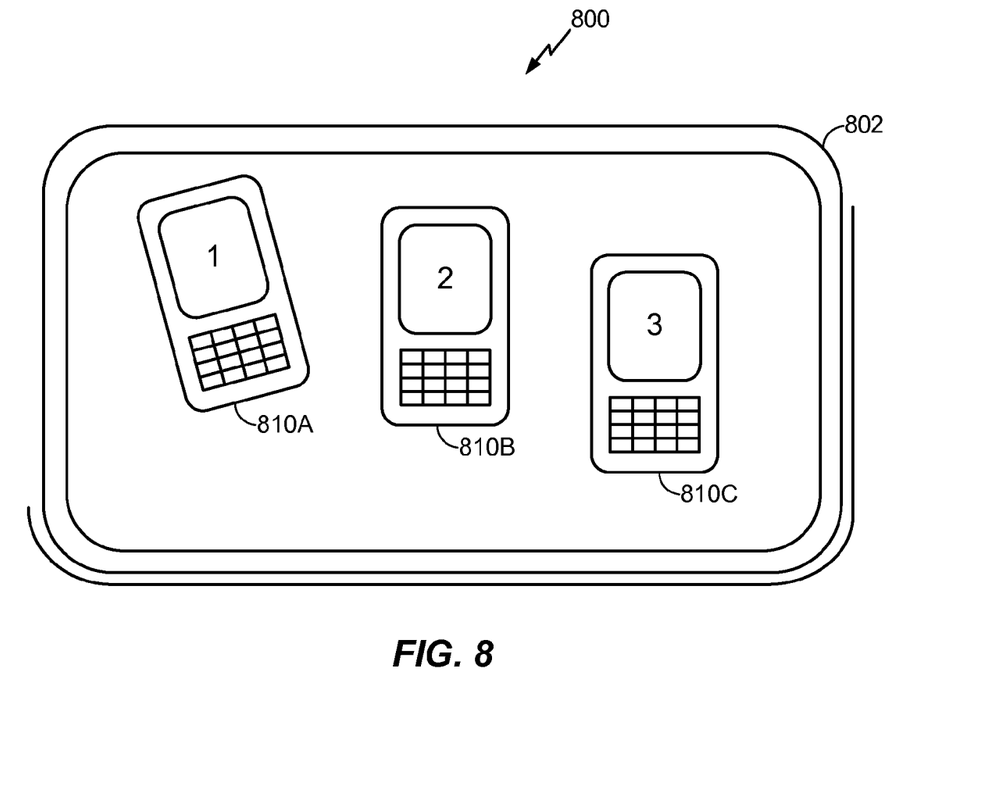
FIG. 8 is a system including a wireless power device and a plurality of electronic devices positioned within a charging region of the wireless power device, in accordance with an exemplary embodiment of the present invention.

FIG. 8 is a depiction of a wireless power system 800. As illustrated in FIG. 8, wireless power system 800 includes a wireless power device 802 including a wireless power transmitter (not shown in FIG. 8, see wireless power transmitter 702 of FIG. 7). Moreover, wireless power system 800 includes a plurality of electronic devices 810A, 810B, and 810C, wherein each electronic device 810A, 810B, and 810C includes a wireless power receiver (not shown in FIG. 8; see wireless power receivers 710A, 710B, and 710C of FIG. 7). It is noted that wireless power device 802 may comprise wireless power transmitter 702 of FIG. 7, and electronic devices 810A, 810B, and 810C may respectively comprise wireless power receivers 710A, 710B, and 710C of FIG. 7.

With reference to equation (3), as will be understood by a person having ordinary skill in the art, variations in impedance due to multiple receivers, which may control the distribution of power to the receivers, may arise from variations in $M_{12n}$ and the loads $R_{rxn}$. Furthermore, the mutual inductance between the transmitting coil and a receiver may vary according to the placement of a receiver, size of a receiver, and windings of a transmit coil. For example, with reference to FIG. 8, if a transmit coil of wireless power device 802 is wound along the perimeter of the charging platform of device 802, the mutual inductance will vary according to the placement of receivers 810A, 810B, and 810C. Moreover, if the coil is wound with a common radius for all turns, the receivers with the highest mutual inductance $M_{12i}$ with the transmitting coil may be receiver 810A and receiver 810C and the device with the lowest mutual inductance $M_{12i}$ with the transmitting coil may be receiver 810B. On the other hand if the coil is wound in an equally spaced spiral form, the receivers with the lowest mutual inductance $M_{12i}$ will be receiver 810A and receiver 810C and receiver 810B may have the highest mutual inductance $M_{12i}$. If the coil is wound to achieve even magnetic field distribution, then the mutual inductance $M_{12i}$ may be substantially the same for all receivers 810A, 810B, and 810C.

It is noted that a receiver having a low mutual inductance with a transmitter may lower its load resistance $R_{rxi}$ to make up from its low mutual inductance $M_{12i}$ and still present a substantial amount of impedance to the transmitter. On the other hand, if the receiver is placed too near to the edge of a transmitter and presents an impedance that is too high, it can increase its load resistance $R_{rxi}$ to lower the impedance presented to the transmitting to a reasonable level.

According to one exemplary embodiment of the present invention, during one stage (e.g., a design stage), a number or turns and spacing between the turns of for each receiving coil (e.g., receiving coil 712A, receiving coil 712B, and receiving coil 712C) may be selected to provide an optimal efficiency of wireless power transfer given a particular transmit coil (e.g., transmit coil 704). Furthermore, a variation in mutual inductance with the transmit coil as a function of location may be determined for each receiving coil. Additionally, a "keep out" distance, which may comprise a desired minimum distance between a receiver and transmit coil, may be determined to ensure a variation of mutual inductance for each receiver is less than a ratio of 2 to 1 (i.e., 2:1).

According to one exemplary embodiment of the present invention, during one phase of another stage (e.g., an operational stage), a load resistance of each receiver may be varied to distribute power to each receiving device according to a need of each receiver or according to a desired power distribution scenario among the devices. For example only, transmitter 702, which in this example may be located within a coffee shop, may wish to send more power to receiver 710C than receivers 710A and 710B because a user of receiver 710C purchased a cup of coffee and users of receivers 710A and 710B did not. Accordingly, in this example, a load resistance of receiver 710C may be decreased, the load resistances of receivers 710A and 710B may be increased, or a combination thereof. As another example, a power distribution scenario may depend on the type of devices positioned within a charging region or the location of the devices within the charging region. For example, a user may wish that a mobile telephone receives twice as much power as a media player. As another example, devices positioned in the middle of a charging region (i.e., away from a transmit antenna) may receive more power than devices positioned near the edges of the charging region (i.e., near the transmit antenna).

As noted above, transmitter 702 may configured to measure, via, for example, a clocking method, an impedance as seen by transmitter 702 due to each receiver 710A, 710B, and 710C. Further, in response to a desired power distribution scenario (e.g., each receiver 710A, 710B, and 710C are to receive equal power or receiver 710C is to receive half as much power as receiver 710A and receiver 710B), transmitter 702 and, more specifically, a controller of transmitter 702 (e.g., controller 214 of FIG. 4) may be configured to determine whether, and to what extent an initial load resistance of each of receivers 710A, 710B, and 710C should be modified. Moreover, the controller may be configured to request, via a respective communication link 713A, 713B, or 713C, at least one receiver of receivers 710A, 710B, and 710C to modify an associated load resistance to achieve the desired power distribution among receivers 710A, 710B, and 710C. In response to a request from transmitter 702, receivers 710A, 710B, and 710C may be configured to appropriately adjust an associated load resistance, as described above.

Furthermore, during another phase of this stage a load resistance of all receivers may be varied to achieve a desired, total impedance (i.e., an optimum impedance) as detected by the TX coil due to all receivers (require communication link between TX and RX). It is noted that the term "optimum" generally means that the system is achieving maximum end to end efficiency. It is noted that a controller (e.g., controller 214 of FIG. 4) of transmitter 702 may also be configured to request, via a respective communication link 713A, 713B, or 713C, each of receivers 710A, 710B, and 710C to modify an associated load resistance to achieve a desired total impedance as seen by transmitter 720. In response to a request from transmitter 702, receivers 710A, 710B, and 710C may be configured to appropriately adjust an associated load resistance, as described above.

It is noted that a stage in which a load resistance of each receiver may be varied to distribute power to each receiving device according to a need of each receiver or according to a desired power distribution scenario among the devices and a stage in which a load resistance of all receivers may be varied to achieve a desired, total impedance may occur substantially simultaneously.

Figure 9:
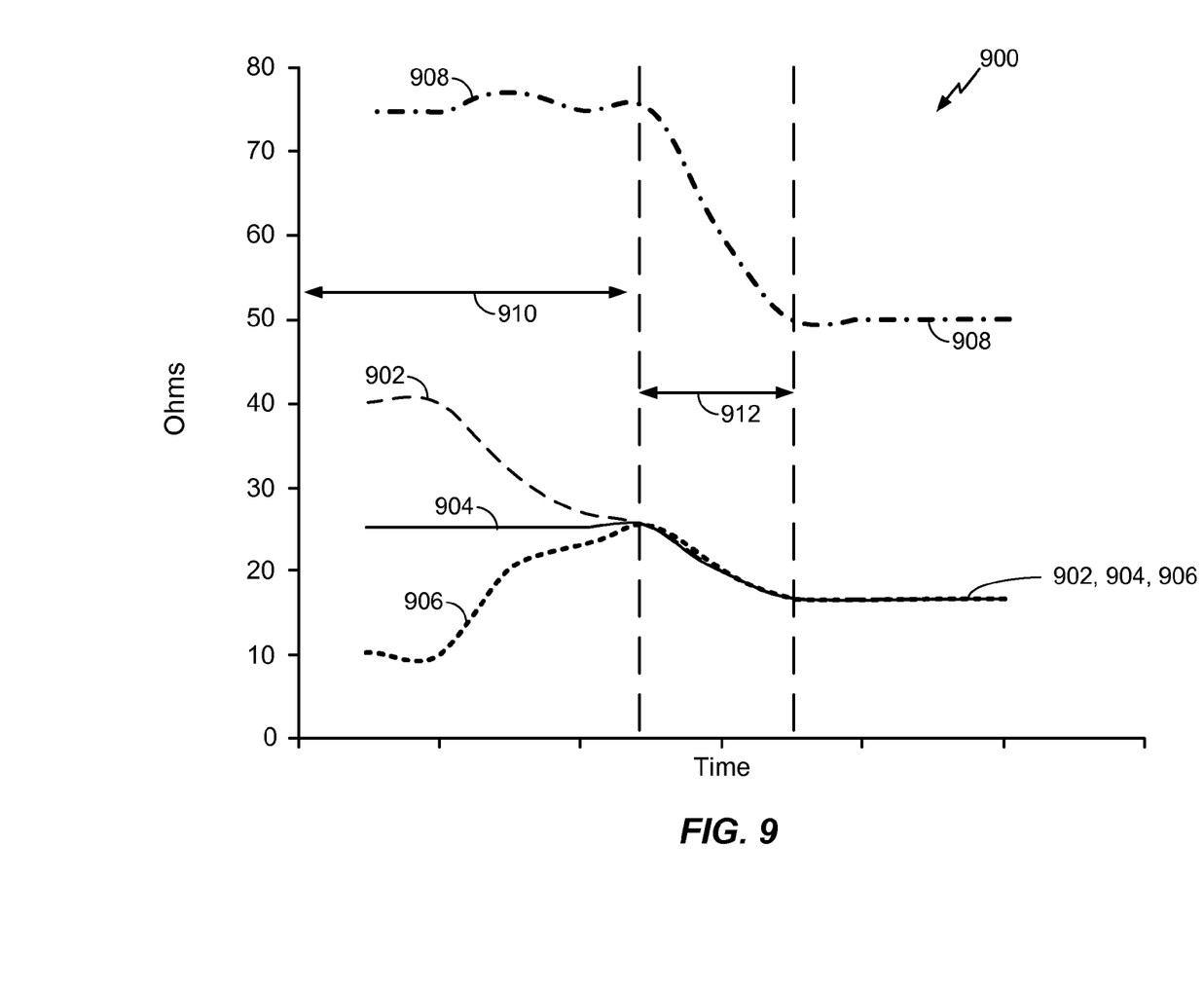
FIGS. 9-11 are plots illustrating various impedances of a wireless power system, according to an exemplary embodiment of the present invention.

With reference to the plots illustrated in FIGS. 9-11, various examples operations of a wireless power system, according to one or more exemplary embodiments of the present invention, will now be described. FIG. 9 illustrates a plot 900 depicting impedances as detected by a wireless power transmitter due to each receiver of a plurality of receivers within a charging region of the wireless power transmitter. Specifically, plot 900 depicts impedances of a wireless power system including three (3) receivers within a charging region of a wireless power transmitter, wherein a desired power distribution scenario comprises conveying an equal amount of power to each of the three receivers. Plot 900 further depicts a total impedance detected by the transmitter due to all receivers of the plurality of receivers. It is noted that plot 900 illustrates the variations of the depicted impedances over time and during phases of a stage of operation. With reference to FIGS. 7 and 9, an impedance of receiver 710A is depicted by a signal 902, an impedance of receiver 710B is depicted by a signal 904, and an impedance of receiver 710C is depicted by a signal 906. A total impedance as seen by transmitter 702 is represented by signal 908. According to one exemplary embodiment of the present invention, during a stage, which is depicted by reference numeral 910, a load resistance of one or more of receivers 710A, 710B, and 710C may be varied to distribute an equal amount of power to each of receiver 710A, 710B, and 710C. For example, a load resistance of receiver 710A may be increased to decrease an impedance as seen by transmitter 702 due to receiver 710A. In addition, a load resistance of receiver 710C may be decreased to increase an impedance as seen by transmitter 702 due to receiver 710C. As illustrated in FIG. 9, at the end of stage 910, signals 902, 904, and 906 are each equal and, therefore, receiver 710A, 710B, and 710C are receiving an equal amount of power.

According to another exemplary embodiment of the present invention, during a stage, which is depicted by reference numeral 912, a load resistance of each of receiver 710A, 710B, and 710C may be adjusted to achieve a desired total impedance (i.e., an optimum impedance) as detected by transmitter 702 due to receivers 710A, 710B, and 710C. As illustrated in FIG. 9, at the end of stage 912, signal 908 is at approximately 50 ohms, which in this example, is the desired, optimum total impedance.

Figure 10:
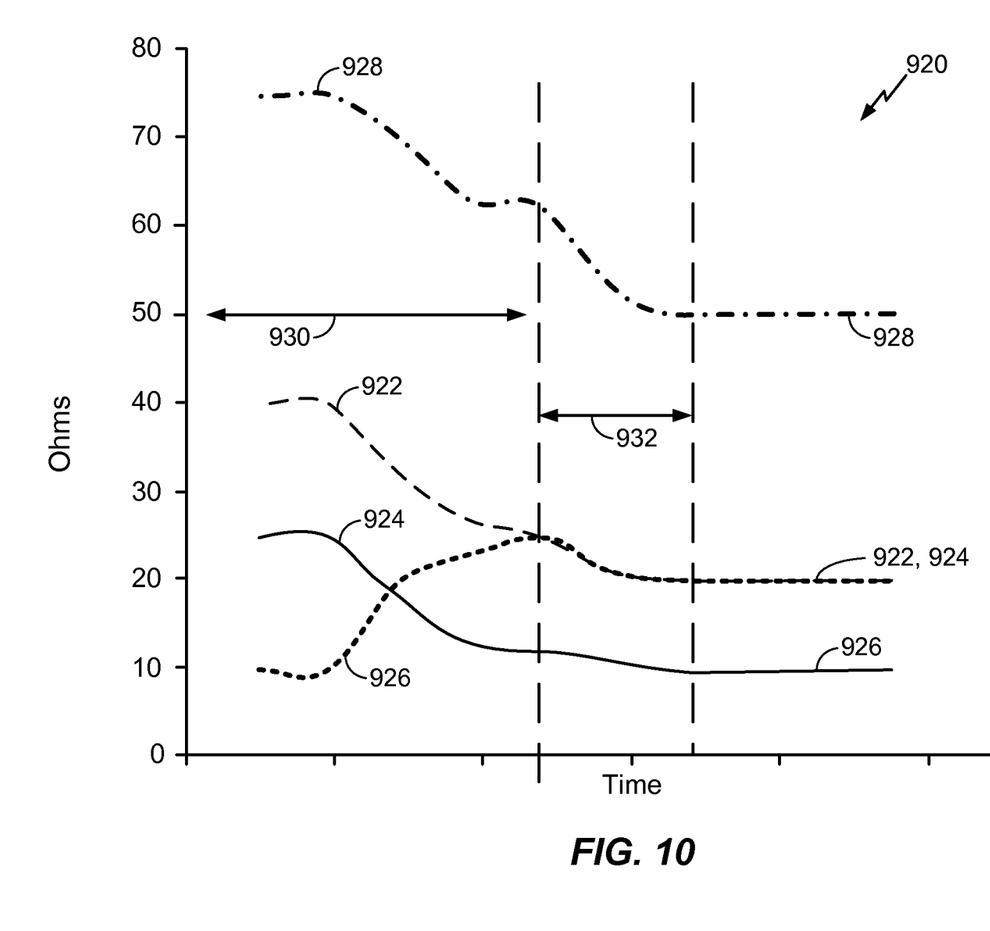

FIG. 10 illustrates a plot 920 depicting impedances as detected by a wireless power transmitter due to each receiver of a plurality of receivers within a charging region of the wireless power transmitter. Specifically, plot 920 depicts impedances of a wireless power system including three (3) receivers within a charging region of a wireless power transmitter, wherein a desired power distribution scenario comprising transmitting equal power to two receivers and transmitting half of the amount of power being received by the two receivers to another receiver. Plot 920 further depicts total impedance detected by the transmitter due to all receivers of the plurality of receivers. It is noted that plot 920 illustrates the variations of the depicted impedances over time and during phases of a stage of operation. With reference to FIGS. 7 and 10, an impedance of receiver 710A is depicted by a signal 922, an impedance of receiver 710B is depicted by a signal 924, and an impedance of receiver 710C is depicted by a signal 926. A total impedance as seen by transmitter 702 is represented by signal 928. According to one exemplary embodiment of the present invention, during a stage, which is depicted by reference numeral 930, a load resistance of one or more of receivers 710A, 710B, and 710C may be varied to distribute an equal amount of power to receivers 710A and 710C, and a lesser amount (i.e., one-half of the amount of power being received by 710A and 710C) to receiver 710B. For example, a load resistance of receiver 710A may be increased to decrease an impedance as seen by transmitter 702 due to receiver 710A. Further, a load resistance of receiver 710C may be increased to decrease an impedance as seen by transmitter 702 due to receiver 710C. In addition, a load resistance of receiver 710C may be decreased to increase an impedance as seen by transmitter 702 due to receiver 710C. As illustrated in FIG. 10, at the end of stage 930, signals 922 and 926 are each equal and, therefore, receiver 710A and receiver 710C are receiving an equal amount of power. Further, at the end of stage 930, signal 924 is half of the value of signals 922 and 926 and, therefore, receiver 710B is receiving half of the amount of power being received by receiver 710A and receiver 710C. It is noted that FIG. 10 shows the impedance as seen by the transmitter; therefore, a lower impedance represents a lower level of power delivered to the receiver.

According to another exemplary embodiment of the present invention, during a stage, which is depicted by reference numeral 932, a load resistance of each of receiver 710A, 710B, and 710C may be adjusted to achieve a desired total impedance (i.e., an optimum impedance) as detected by transmitter 702 due to receivers 710A, 710B, and 710C. As illustrated in FIG. 10, at the end of stage 932, signal 928 is at approximately 50 ohms, which in this example, is the desired, optimum total impedance.

Figure 11:
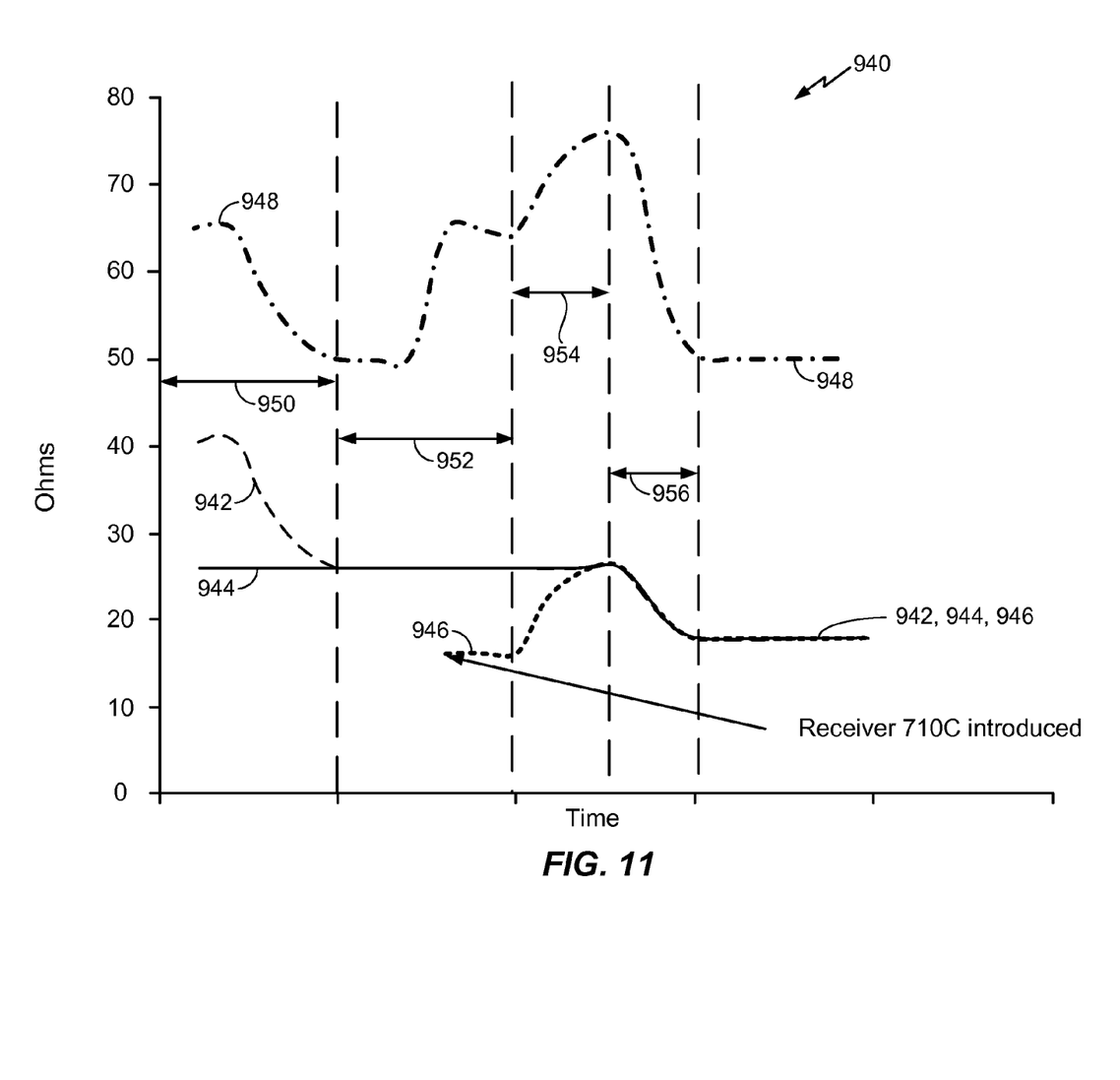

FIG. 11 illustrates a plot 940 depicting impedances as detected by a wireless power transmitter due to each receiver of a plurality of receivers within a charging region of the wireless power transmitter. Specifically, plot 940 depicts impedances of a wireless power system including, initially, two (2) receivers, and then three (3) receivers within a charging region of a wireless power transmitter, wherein a desired power distribution scenario comprises initially transmitting an equal amount of power to the two receivers and then transmitting an equal amount of power to the three receivers. Further, plot 940 illustrates an impedance of a third receiver, which is positioned within the charging region of the wireless power transmitter after the other two receivers have begun receiving power. Plot 940 further depicts total impedance detected by the transmitter due to all receivers of the plurality of receivers. It is noted that plot 940 illustrates the variations of the depicted impedances over time and during phases of a stage of operation. With reference to FIGS. 7 and 11, an impedance of receiver 710A is depicted by a signal 942, an impedance of receiver 710B is depicted by a signal 944, and an impedance of receiver 710C is depicted by a signal 946. A total impedance as seen by transmitter 702 is represented by signal 948. According to one exemplary embodiment of the present invention, during a stage, which is depicted by reference numeral 950, a load resistance of one or more of receivers 710A and 710B may be varied to distribute an equal amount of power to receivers 710A and 710B. For example, a load resistance of receiver 710A may be increased to decrease an impedance as seen by transmitter 702 due to receiver 710A. As illustrated in FIG. 11, at the end of stage 950, signals 942 and 944 are each equal and, therefore, receiver 710A and receiver 710B are receiving an equal amount of power. It is noted that during a stage 952 prior to introduction of receiver 710C, the total impedance as seen by transmitter 702 (i.e., signal 948) is at an optimum value (i.e., 50 ohms). During stage 952, receiver 710C is positioned within a charging region of transmitter 702. During a stage 954 a load resistance of one or more of receivers 710A, 710B, and 710C may be varied to distribute an equal amount of power to each of receiver 710A, 710B, and 710C. For example, a load resistance of receiver 710C may be decreased to increase an impedance as seen by transmitter 702 due to receiver 710C. As illustrated in FIG. 11, at the end of stage 954, signals 942, 944, and 946 are each equal and, therefore, receiver 710A, 710B, and 710C are receiving an equal amount of power.

According to another exemplary embodiment of the present invention, during a stage, which is depicted by reference numeral 956, a load resistance of each of receiver 710A, 710B, and 710C may be adjusted to achieve a desired, total impedance (i.e., an optimum impedance) as detected by transmitter 702 due to receivers 710A, 710B, and 710C. As illustrated in FIG. 11, at the end of stage 956, signal 948 is at approximately 50 ohms, which in this example, is the desired, optimum total impedance.

Figure 12:
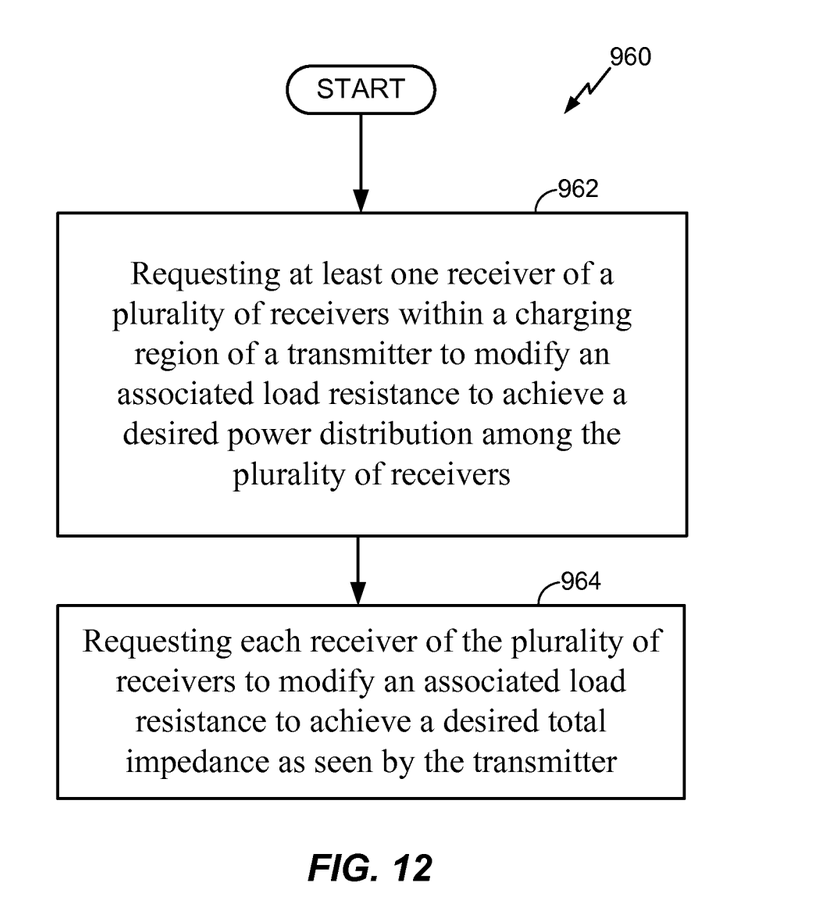
FIG. 12 is a flowchart illustrating a method, in accordance with an exemplary embodiment of the present invention.

FIG. 12 is a flowchart illustrating a method 960, in accordance with one or more exemplary embodiments. Method 960 may include requesting at least one receiver of a plurality of receivers within a charging region of a transmitter to modify an associated load resistance to achieve a desired power distribution among the plurality of receivers (depicted by numeral 962). Method 960 may further include requesting each receiver of the plurality of receivers to modify an associated load resistance to achieve a desired total impedance as seen by the transmitter (depicted by numeral 964).

Figure 13:
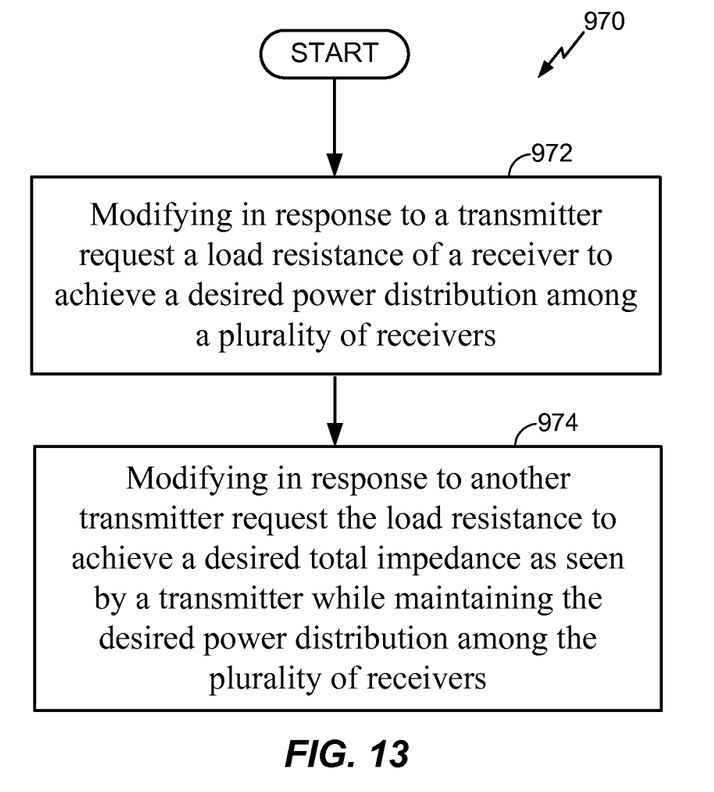
FIG. 13 is a flowchart illustrating another method, in accordance with an exemplary embodiment of the present invention.

FIG. 13 is a flowchart illustrating another method 970, in accordance with one or more exemplary embodiments. Method 970 may include modifying in response to a transmitter request a load resistance of a receiver to achieve a desired power distribution among a plurality of receivers (depicted by numeral 972). Method 970 may further include modifying in response to another transmitter request the load resistance to achieve a desired total impedance as seen by a transmitter while maintaining the desired power distribution among the plurality of receivers (depicted by numeral 974).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method for controlling power distribution, comprising:

requesting a first receiver of a plurality of receivers having a plurality of load resistances, respectively, within a charging region of a transmitter, the first receiver having a first load resistance, to modify the first load resistance to a value that achieves a target power distribution among the plurality of receivers; and transmitting power wirelessly within the charging region.

2. The method of claim 1, further comprising determining an initial load resistance of each receiver of the plurality of receivers.

3. The method of claim 1, further comprising determining the target power distribution for the plurality of receivers.

4. The method of claim 1, further comprising:
determining if each respective load resistance of each receiver of the plurality of receivers should be modified; and
determining a value that each respective load resistance of each receiver should be modified to so that the target power distribution for the plurality of receivers is achieved.

5. The method of claim 1, further comprising substantially simultaneously:
requesting the first receiver of the plurality of receivers within the charging region of the transmitter to modify the first load resistance to the value that achieves the target power distribution; and
requesting each receiver of the plurality of receivers to modify each respective load resistance to the value that achieves the target total impedance.

6. The method of claim 1, the requesting a first of a plurality of receivers comprising requesting the first receiver of the plurality of receivers to decrease the first load resistance to a value that increases an amount of power delivered to the first receiver.

7. The method of claim 1, the requesting a first receiver of a plurality of receivers comprising requesting the first receiver of the plurality of receivers to increase the first load resistance to a value that decreases an amount of power delivered to the first receiver.

8. The method of claim 1, the requesting a first receiver of a plurality of receivers comprising requesting the first receiver of the plurality of receivers to decrease the first load resistance to a value that decreases an amount of power delivered to at least one other receiver of the plurality of receivers.

9. A transmitter for controlling power distribution, comprising:
an antenna configured to communicate with a first receiver of a plurality of receivers having a plurality of load resistances, respectively, within a charging region of the antenna, the first receiver having a first load resistance; and
a controller in communication with the antenna and configured to
request the first receiver to modify the first load resistance to a value that achieves a target power distribution among the plurality of receivers.

10. The transmitter of claim 9, wherein the controller is further configured to determine an initial load resistance of each receiver of the plurality of receivers.

11. The transmitter of claim 9, wherein the controller is further configured to determine the target power distribution for the plurality of receivers.

12. The transmitter of claim 9, wherein the controller is further configured to determine if each respective load resistance of each receiver of the plurality of receivers should be modified and determine a value that each respective load resistance of each receiver should be modified to so that the target power distribution for the plurality of receivers is achieved.

13. The transmitter of claim 9, wherein the controller is further configured to substantially simultaneously request the first receiver of the plurality of receivers within the charging region of the transmitter to modify the first load resistance to the value that achieves the target power distribution and request each receiver of the plurality of receivers to modify each respective load resistance to the value that achieves the target total impedance.

14. The transmitter of claim 9, further comprising a transmit antenna configured to wirelessly transmit power within the charging region.

15. The transmitter of claim 9, wherein the controller is further configured to request the first receiver of the plurality of receivers to decrease the first load resistance to a value that increases increase an amount of power delivered to the first receiver.

16. The transmitter of claim 9, wherein the controller is further configured to request the first receiver of the plurality of receivers to increase the first load resistance to a value that decreases decrease an amount of power delivered to the first receiver.

17. A device for controlling power distribution, comprising:
means for requesting a first receiver of a plurality of receivers having a plurality of load resistances, respectively, within a charging region of a transmitter, the first receiver having a first load resistance, to modify the first load resistance to a value that achieves a target power distribution among the plurality of receivers; and
means for transmitting power wirelessly within the charging region.

18. The device of claim 17, further comprising:
means for determining if each respective load resistance of each receiver of the plurality of receivers should be modified; and
means for determining a value that each respective load resistance of each receiver should be modified to so that the target power distribution for the plurality of receivers is achieved.

19. The device of claim 17, further comprising means for substantially simultaneously requesting the first receiver of the plurality of receivers within the charging region of the transmitter to modify the first load resistance to the value that achieves the target power distribution and requesting each receiver of the plurality of receivers to modify each respective load resistance to the value that achieves the target total impedance.

20. The device of claim 17, further comprising means for determining an initial load resistance of each receiver of the plurality of receivers.

21. The method of claim 1, further comprising requesting each receiver of the plurality of receivers to modify each respective load resistance to a value that achieves a target total impedance as observed by the transmitter while maintaining the target power distribution among the plurality of receivers.

22. The transmitter of claim 9, wherein the controller is further configured to request each receiver of the plurality of receivers to modify each respective load resistance to a value that achieves a target total impedance as observed by the transmitter while maintaining the target power distribution among the plurality of receivers.

23. The device of claim 17, further comprising means for requesting each receiver of the plurality of receivers to modify each respective load resistance to a value that achieves a target total impedance as observed by the transmitter while maintaining the target power distribution among the plurality of receivers.

* * * * *